(12) United States Patent
Nelson et al.

(10) Patent No.: US 7,326,860 B2
(45) Date of Patent: Feb. 5, 2008

(54) ROUTING VIAS IN A SUBSTRATE FROM BYPASS CAPACITOR PADS

(75) Inventors: Jerimy Nelson, Fort Collins, CO (US); Mark D. Frank, Longmont, CO (US); Peter Shaw Moldauer, Wellington, CO (US); Gary Taylor, Windsor, CO (US); David Quint, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 108 days.

(21) Appl. No.: 11/446,669

(22) Filed: Jun. 5, 2006

(65) Prior Publication Data

US 2006/0225916 A1     Oct. 12, 2006

Related U.S. Application Data

(62) Division of application No. 10/940,100, filed on Sep. 14, 2004, now Pat. No. 7,075,185.

(51) Int. Cl.
 *H01R 12/04* (2006.01)
 *H05K 1/11* (2006.01)

(52) U.S. Cl. .................. 174/262; 174/255

(58) Field of Classification Search .......... 174/262, 174/261, 255, 260; 361/792, 793, 794, 795
See application file for complete search history.

(56) References Cited

U.S. PATENT DOCUMENTS

| | | | | |
|---|---|---|---|---|
| 5,672,911 A | * | 9/1997 | Patil et al. ............... | 257/691 |
| 5,691,568 A | * | 11/1997 | Chou et al. ............... | 257/691 |
| 5,886,406 A | * | 3/1999 | Bhansali .................. | 257/698 |
| 6,344,961 B1 | | 2/2002 | Naito et al. | |
| 6,362,525 B1 | * | 3/2002 | Rahim ..................... | 257/738 |
| 6,440,770 B1 | | 8/2002 | Banerjee et al. | |
| 6,620,728 B2 | | 9/2003 | Lin | |
| 6,707,145 B2 | | 3/2004 | Pollock et al. | |

\* cited by examiner

*Primary Examiner*—Ishwar (I. B.) Patel

(57) ABSTRACT

A multilayer substrate having a bonding surface is disclosed. One embodiment of the substrate may comprise a bypass capacitor connection pad disposed on the bonding surface. The bypass capacitor connection pad may have a bypass capacitor power pad and a bypass capacitor ground pad. The substrate may also comprise a plurality of power vias routed from the bypass capacitor power pad to a first redistribution layer spaced apart from the bonding surface and a plurality of ground vias routed from the bypass capacitor ground pad to the first redistribution layer. The substrate may further comprise a plurality of power and ground vias routed from the first redistribution layer to a second redistribution layer according to a power and ground via pattern array, wherein the plurality of ground vias are jogged at the first redistribution layer to the plurality of power vias to form the power and ground via pattern array.

8 Claims, 7 Drawing Sheets

ROUTING VIAS IN A SUBSTRATE FROM BYPASS CAPACITOR PADS

RELATED APPLICATION

This application is a divisional of U.S. patent application Ser. No. 10/940,100, filed Sep. 14, 2004 now U.S. Pat. No. 7,075,185.

BACKGROUND

Electronic systems typically employ several different types of electrical interconnecting apparatus having planar layers of electrically conductive material separated by dielectric layers. Some of the conductive layers may be patterned to form electrically conductive signal lines or "traces" to different layers to provide electrical contacts between signals, power and ground terminals. For example, integrated circuits typically have several layers of conductive traces which interconnect electronic devices formed upon and within a semiconductor substrate. Additionally, these electrical traces may be used to electrically connect to pins or leads of the integrated circuits. These pins and leads may then be coupled to a multi-layer ceramic substrate or device package that provide intermediate routing from the integrated circuit pins to terminals of a printed circuit board (PCB). The PCB also typically includes several layers of conductive traces separated by dielectric layers. The conductive traces are used to electrically interconnect terminals of electronic devices mounted upon the PCB.

Signal frequencies of digital electronic systems are continually increasing. In multi-layer structures (e.g., printed wire boards, ceramic substrates, and/or semiconductor structures), the influence of inductance, capacitance and resistance of different physical layers of the die and package have significant effects on the integrity of the digital electronic system as frequencies increase. The effects can include including signal degradation due to reflections, power supply "droop", ground "bounce", and increased electromagnetic emissions. One technique for mitigating power supply droop is the placement of "bypass" or "decoupling" capacitors. The bypass capacitors have power and ground connections that are coupled to the power and ground connections of the die through vias that are routed through the package (e.g., multilayer ceramic (MLC) substrate, printed circuit board (PCB).

As power supply voltages continue to decrease and chip speeds continue to increase, the inductance associated with power and ground loops due to the routing of power and ground signals from the package to the die becomes increasingly problematic. Additionally, as power supply voltages (e.g., integrated circuit power supply voltages) become more sensitive to inductance associated with coupling the power supply voltages to circuit components, the inductance associated with coupling bypass capacitors to the power supply voltage becomes more problematic.

SUMMARY

One embodiment of the present invention may comprise a method for routing vias through a multilayer substrate having a plurality of layers extending between a first surface and a second surface. The method may comprise arranging a bypass capacitor power pad spaced spaced apart from a bypass capacitor ground pad on the first surface, routing a plurality of power vias from the bypass capacitor power pad to a first redistribution layer spaced from the first surface, and routing a plurality of ground vias from the bypass capacitor ground pad to the first redistribution layer. The methodology may further comprise jogging the plurality of ground vias at the first redistribution layer to the plurality of power vias to provide a power and ground via pattern, and routing the power and ground vias from the first redistribution layer to a second redistribution layer spaced apart from the first redistribution layer based on the power and ground via pattern.

Another embodiment may comprise a multilayer substrate having a bonding surface. The substrate may comprise a bypass capacitor connection pad disposed on the bonding surface. The bypass capacitor connection pad may include a bypass capacitor power pad and a bypass capacitor ground pad. The substrate may further comprise a plurality of power vias routed from the bypass capacitor power pad to a first redistribution layer spaced apart from the bonding surface, and a plurality of ground vias routed from the bypass capacitor ground pad to the first redistribution layer. The substrate may also comprise a plurality of power and ground vias routed from the first redistribution layer to a second redistribution layer according to a power and ground via pattern array. The plurality of ground vias may be jogged at the first redistribution layer to the plurality of power vias to form the power and ground via pattern array.

Yet another embodiment may comprise a multilayer substrate having a bonding surface. The substrate may comprise a bypass capacitor multiple connection pad disposed on the bonding surface. The bypass capacitor multiple connection pad may have an interleaved pattern of a bypass capacitor power pads and bypass capacitor ground pads both at a first side and a second side of the bypass capacitor multiple connection pad. The substrate may further comprise a power via column, associated with each of the plurality of bypass capacitor power pads, that extends from the bonding surface to a first redistribution layer spaced apart from the bonding surface, and a ground via column, associated with each of the plurality of bypass capacitor ground pads, that extends from the bonding surface to the first redistribution layer. The substrate may further comprise a plurality of power and ground vias routed from the first redistribution layer to a second redistribution layer that is spaced apart from the first redistribution layer according to a power and ground via pattern array, wherein the ground via columns are jogged at the first redistribution layer to a location adjacent a first side of a respective power via column to provide the power and ground via pattern array.

Still yet another embodiment may comprise a multilayer substrate having a having a first surface and a second surface. The substrate may comprise a bypass capacitor connection pad disposed on the first surface. The bypass capacitor connection pad may have a bypass capacitor power pad and a bypass capacitor ground pad. The substrate may comprise a plurality of power vias that extend from the bypass capacitor power pad to a first internal layer, and a plurality of ground vias that extend from the first surface to the first internal layer wherein the plurality of ground vias may be interleaved with a plurality of ground plated through holes (PTHs) disposed on the first internal layer. A first conductive line may couple the plurality of ground vias at the first surface to the bypass capacitor ground pad, and a second conductive line may couple the plurality of ground vias to the plurality of ground PTHs. A plurality of additional conductive lines may couple the plurality of power vias to a plurality of power PTHs by jogging the power vias to the plurality of power PTHs.

Another embodiment may comprise a method for routing vias through a multilayer substrate having a first surface and a second surface. The method may comprise arranging a bypass capacitor power pad spaced apart from a bypass capacitor ground pad on the first surface, routing a plurality of power vias from the bypass capacitor power pad to a first internal layer and coupling a plurality of ground vias to the bypass capacitor ground pad. The plurality of ground vias may be located on the bonding surface disposed above a plurality of ground plated through holes (PTHs) disposed on the first internal layer. The methodology may further comprise routing the plurality of ground vias to the first internal layer, coupling the plurality of ground vias to the plurality of ground PTHs via a conductive line, and coupling the plurality of power vias to a plurality of power PTHs by jogging the power vias to the plurality of power PTHs employing respective conductive lines.

DETAILED DESCRIPTION

This disclosure relates generally to routing power and ground vias from bypass or package capacitors through a multilayer substrate (e.g., MLC substrate, PCB). The power and ground vias can provide coupling connections from power and ground pads associated with a bypass capacitor to power and ground connections of an integrated circuit or die. The power and ground vias are routed based on power and ground via patterns that reduce inductance associated with power and ground loops through the multilayer substrate. The bypass capacitor types can include, for example, Low Inductance Chip Capacitors (LICCs), Multilayer Ceramic Capacitors (MLCs), Low Inductance Capacitor Arrays (LICAs), and Inter Digitated Capacitors (IDCs) and other capacitor types of varying characteristics.

A "redistribution layer" as used in this disclosure refers to a layer in which the vias can be jogged and/or grouped together employing conductive lines, so that the vias can be moved to other locations on the redistribution layer, or so that the number of vias can be reduced. A redistribution layer is typically a power layer, a ground layer or a signal layer. "Jogging" as used in this disclosure refers to a via that includes a bend or transition that is substantially transverse to the via direction between layers. For example, a vertical metal via that provides interconnections between layers is typically jogged horizontally along a "redistribution layer" to a location spaced from the vertical metal via. A new via is provided which then can continue vertically to one or more additional layers spaced below the redistribution layer, or the via can be grouped together with one or more other vias to reduce the number of vias for routing to additional layers.

Figure 1:
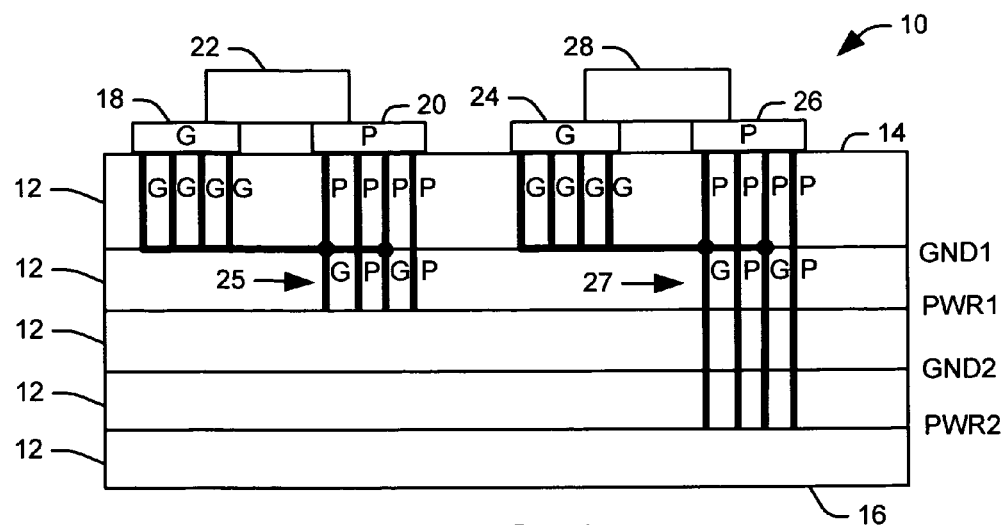
FIG. 1 illustrates a cross-sectional view of an embodiment of a portion of a multilayer substrate having having a bypass capacitor power and ground via pattern.

FIG. 1 illustrates a cross-sectional view of a portion of a multilayer substrate 10 having a first bypass capacitor power and ground via pattern. The multilayer substrate 10 can be a multilayer ceramic substrate, printed circuit board, semiconductor structure, or other multilayer structure for routing signals therethrough. The multilayer substrate 10 includes a plurality of redistribution layers (GND1, PWR1, GND2, PWR2) such as power layers, ground layers and signal layers (not shown). A redistribution layer is a layer in which vias are redistributed employing one or more conductive lines. The plurality of power layers, ground layers and signal layers can be interposed between one or more dielectric layers 12. The multilayer substrate 10 includes an internal bond surface 14 having a plurality of bypass capacitor bond pads (18, 20, 24, 26) for bonding bypass capacitors (22, 28) to the multilayer substrate 10. The multilayer substrate 10 can also include bond pads (not shown) for coupling to pins of an integrated circuit associated with a circuit die. The multilayer substrate 10 also includes an external bond surface 16 having a plurality of external bond pads (not shown) for coupling the substrate to a printed circuit board or other multilayer device. The external bond pads can be a ball grid array (BGA), a pin grid array (PGA) or land grid array (LGA). A plurality of bypass capacitors (22, 28) are coupled to the internal bond surface 14, for example, around the perimeter of the internal bond surface 14.

For illustrative purposes, the multilayer substrate 10 includes a first ground layer (GND1), a first power layer (PWR1), a second ground layer (GND2), and a second power layer (PWR2). A first bypass capacitor 22 and a second bypass capacitor 28 are coupled to the internal bond surface 14 of the multilayer substrate 10. The first bypass capacitor 22 is associated with a first power supply and the first power layer, and the second bypass capacitor 28 is associated with a second power supply and the second power layer. A plurality of ground vias (G) extend from a ground pad 18 of the first capacitor 22, and a plurality of power vias (P) extend from a power pad 20 associated with the first capacitor 22. A plurality of ground vias (G) extend from a ground pad 24 of the second capacitor 28, and a plurality of power vias (P) extend from a power pad 26 associated with the second capacitor 28.

At the first ground layer, the ground vias are redistributed employing a plurality of conductive lines. The ground vias associated with the first bypass capacitor 22 are jogged from beneath the ground pad 18 to beneath the power pad 20 at the first ground layer to form an interleaving power and ground via pattern 25. The interleaving power and ground via pattern 25 extends to the first power layer where the power vias associated with the first bypass capacitor 22 are redistributed, and eventually routed to power bond pads (not shown) associated with power connections of an integrated circuit or die. The ground vias associated with the second bypass capacitor 28 are jogged from beneath the ground pad 24 to beneath the power pad 26 at the first ground layer to form an interleaving power and ground via pattern 27. The interleaving power and ground via pattern 27 extends to the second power layer where the power vias associated with the second bypass capacitor 28 are redistributed, and eventually routed to power bond pads (not shown) associated with power connections of an integrated circuit or die.

The redistribution of the power and ground vias also serve to mitigate via bulge at the top surface (internal bond surface) of the multilayer substrates. Via bulge is caused by the difference in expansion/contraction of the typical conductive paste and the typical dielectric material encompassing the vias and etch lines during firing. Therefore, vias which protrude from the surface and that go into the substrate through many layers will tend to form hills on the carrier's mounting surface, and will produce via-bulge. Accordingly, vias are jogged every six to eight layers to mitigate via bulge. Once the power vias are redistributed at respective power layers, the power and ground signals can be routed through the multilayer substrate 10 to internal power and ground connections associated with an integrated circuit or die.

Figure 2:
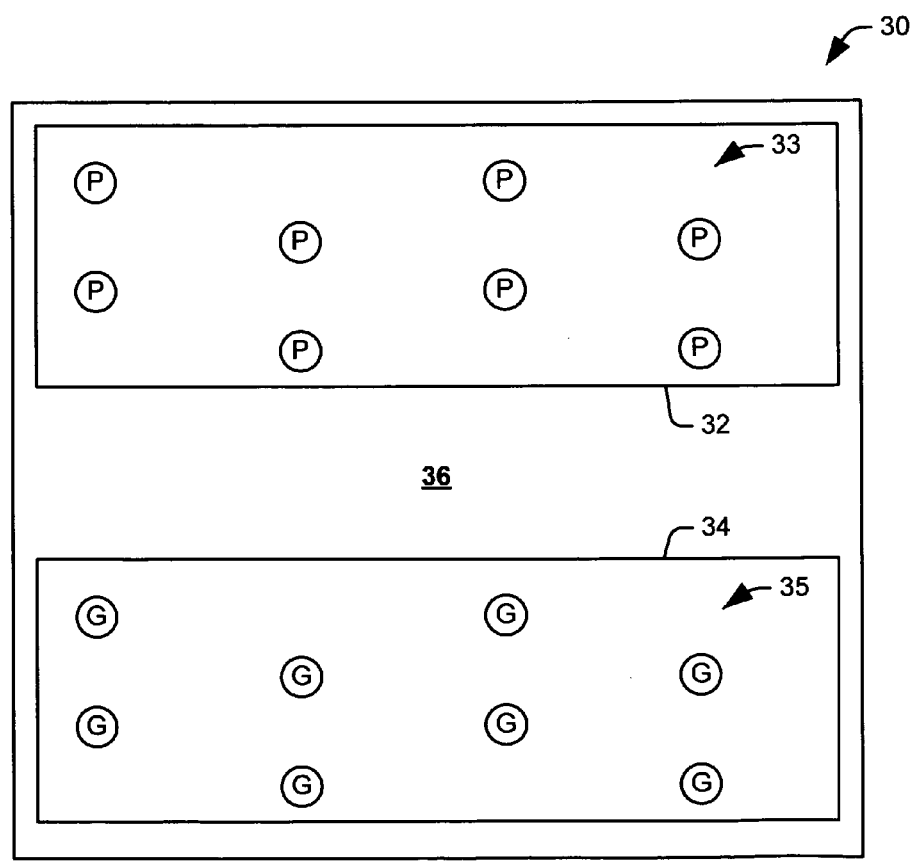
FIG. 2 illustrates an embodiment of a power and ground pad via pattern associated with a bypass capacitor connection pad.

FIG. 2 illustrates an example of power and ground pad via patterns associated with a bypass capacitor connection pad 30. The bypass capacitor connection pad 30 includes a bypass capacitor power pad 32 and a bypass capacitor ground pad 34 residing on a portion of an internal bond surface 36 of a multilayer substrate. The bypass capacitor power pad 32 and the bypass capacitor ground pad 34 are operative for coupling to a Low Inductance Chip Capacitor (LICC), or other capacitor type having a single power and a single ground bypass capacitor connection pad. The bypass capacitor power pad 32 has a power via pattern 33 that includes four columns of power via pairs. Every via pair is offset from an adjacent via pair, with every other via pair having aligned rows. Therefore, space is available between power vias of the power via pair for routing ground vias in a redistribution layer. The bypass capacitor ground pad 34 has a ground via pattern 35 that includes four columns of ground via pairs. Every ground via pair is offset from an adjacent ground via pair, with every other ground via pair having aligned rows. The ground via pattern 35 associated with the bypass capacitor ground pad 34 is similar to the power via pattern 33 associated with the bypass capacitor power pad 32.

Figure 3:
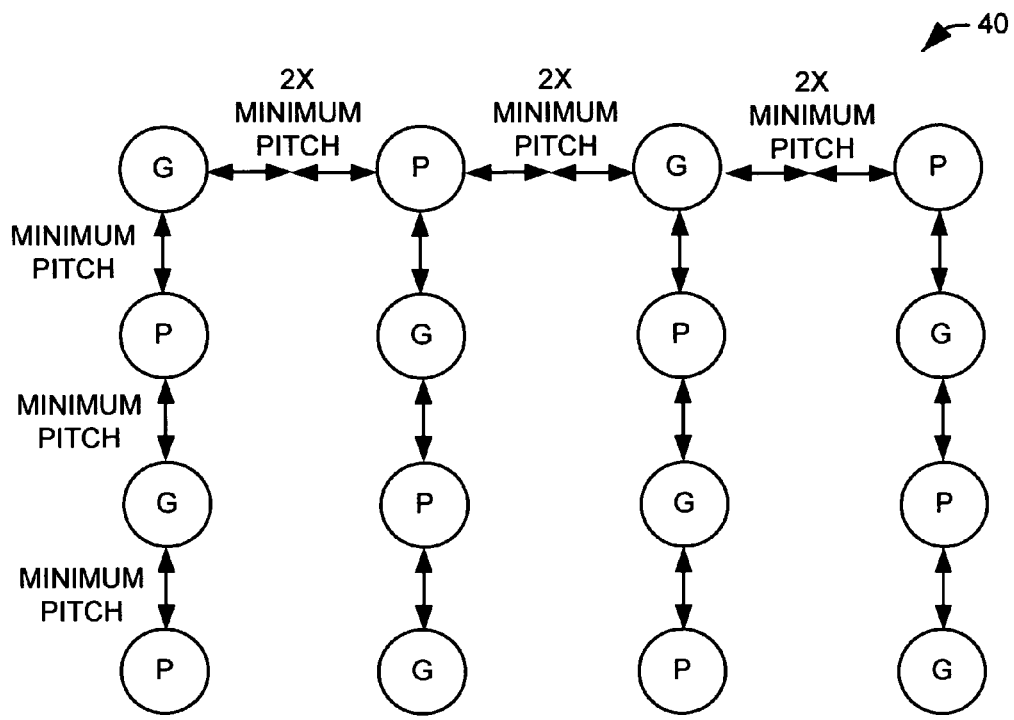
FIG. 3 illustrates an embodiment of a power and ground via pattern at a first redistribution layer associated with the power and ground pad via patterns of FIG. 2.

FIG. 3 illustrates a power and ground via pattern 40 at a first redistribution layer associated with the power and ground pad via patterns 33 and 35 of FIG. 2. The power and ground via pattern 40 can reside at a location below the bypass capacitor power pad 32 after jogging of the ground vias at the first redistribution layer (e.g., the first ground layer as illustrated in FIG. 1). The power and ground via pattern 40 can extend from the first redistribution layer (e.g., a ground layer (GND1, GND2)) space apart from the internal bond surface 36 to a second redistribution layer (e.g., a power layer (PWR1, PWR2)), which is a layer between the first redistribution layer and an external bond surface on an opposite side of the internal bond surface 36 associated with the multilayer substrate. The power and ground via pattern 40 includes interleaving ground vias between power vias at the first redistribution layer 36 and extending the power ground via pattern 40 through the multilayer substrate to a second redistribution layer.

The ground vias can be spaced apart in columns from the power vias at a distance that is substantially equal to the minimum pitch associated with the multilayer substrate. The minimum pitch is the minimum distance required between vias based on the requirements associated with a given multilayer substrate. The placement of ground vias around the power vias at a distance that is substantially equal to the minimum pitch minimizes the inductance between the power and ground vias, thus mitigating deleterious effects associated with power and ground loops caused by routing power and ground signals through the multilayer substrate. The ground vias can be spaced apart in rows from the power vias at a distance that is substantially equal to twice the minimum pitch associated with the multilayer substrate. Therefore, area is provided for routing the ground conductive lines to the ground vias from beneath the bypass capacitor ground pad 34 to beneath the bypass capacitor power pad 32 at the first redistribution layer. It is to be appreciated that the rows and columns can be interchanged if desired, such that the minimum pitch can be provided between power and ground vias in rows and twice the minimum pitch can provided between power and ground vias in columns.

Figure 4:
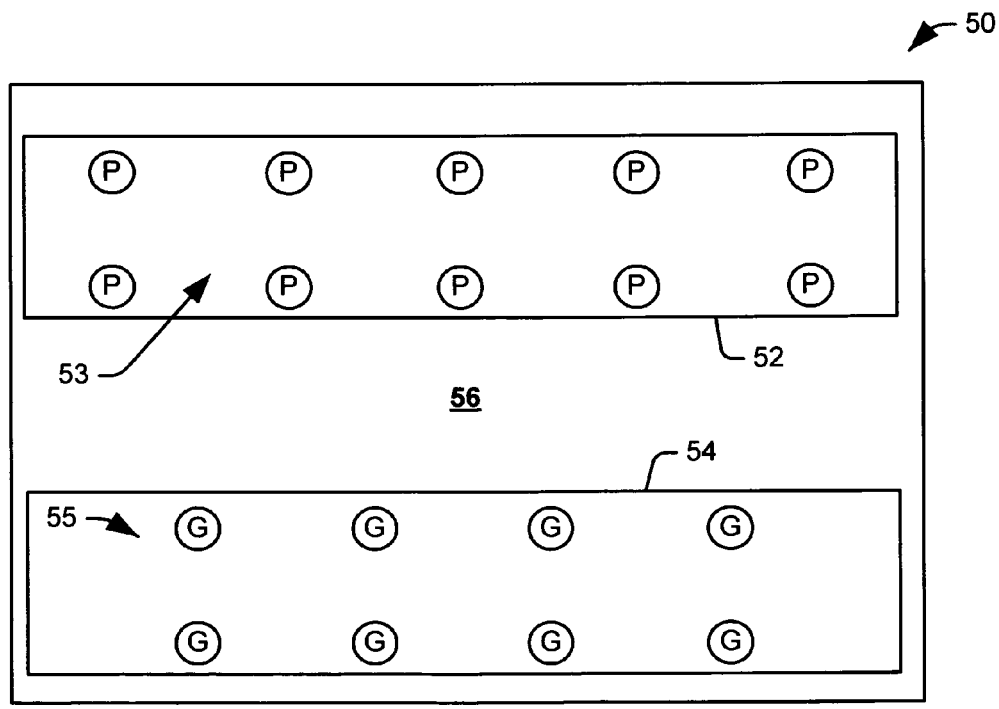
FIG. 4 illustrates another embodiment of power and ground pad via patterns associated with a bypass capacitor connection pad.

FIG. 4 illustrates another example of power and ground pad via patterns associated with a bypass capacitor connection pad 50. The bypass capacitor connection pad 50 includes a bypass capacitor power pad 52 and a bypass capacitor ground pad 54 residing on a portion of an internal bond surface 56 of a multilayer substrate. The power and ground pads are operative for coupling to a LICC, or other capacitor type having a single power and a single ground bypass capacitor connection pad. The bypass capacitor power pad 52 has a power via pattern 53 that includes five columns of power via pairs. A first power via associated with each power via pair is aligned along a first row and a second power via associated with each power via pair is aligned along a second row. The bypass capacitor ground pad 54 has a ground via pattern 55 that includes four columns of ground via pairs. A first ground via associated with each ground via pair is aligned along a first row and a second ground via associated with each ground via pair is aligned along a second row. The ground via pattern 55 includes ground via columns that are offset from power via columns of the power via pattern 53, for example, by a distance substantially equal to the minimum pitch associated with the multilayer substrate, such that columns of ground vias are aligned along a plane that is between planes in which the power vias are aligned, wherein each plane is substantially transverse with the internal bond surface 56.

Figure 5:
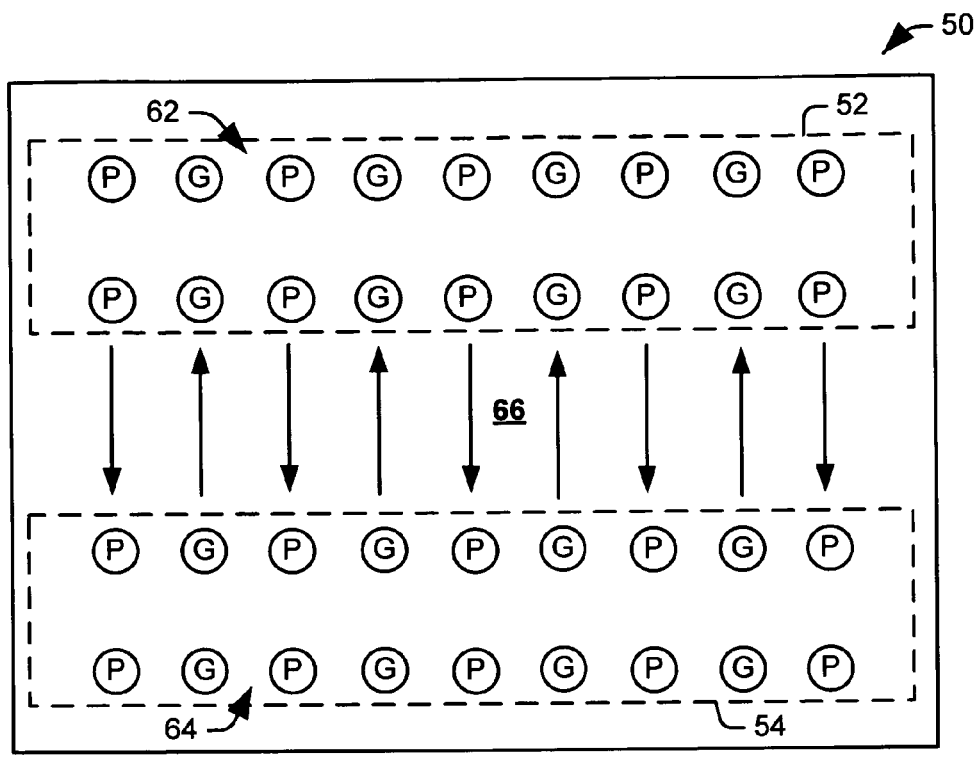
FIG. 5 illustrates another embodiment of power and ground via patterns at a first redistribution layer associated with the power and ground pad via patterns of FIG. 4.

FIG. 5 illustrates power and ground via patterns 62 and 64 at a first redistribution layer 66 associated with the power and ground pad via patterns 53 and 55 of FIG. 4. The dashed lines provide an indication of the location of the power pad 52 that overlies a first power and ground via pattern 62, and the ground pad 54 that overlies the second power and ground via pattern 64 at the internal bond surface 56. In the power and ground via pattern 62, columns of ground vias associated with the ground pad via pattern 55 are jogged to a location between respective columns of power vias associated with the power pad via pattern 53 at the first redistribution layer 66, such as a first ground layer. In the power and ground via pattern 64, columns of power vias associated with the power pad via pattern 53 are jogged to a location between respective columns of ground vias associated with the ground pad via pattern 55 at the first redistribution layer 66. Therefore, both the power and ground via pattern 62 below the bypass capacitor power pad 52 and the power and ground via pattern 64 below the bypass capacitor ground pad 54 have similar power and ground via patterns with interleaving columns of power and ground via pairs. The power and ground via pairs can be separated by a distance that is substantially equal to the minimum pitch associated with the substrate 50. The placement of ground vias around the power vias at a distance that is substantially equal to the minimum pitch minimizes the inductance between the power and ground vias, thus mitigating deleterious effects associated with power and ground loops caused by routing power and ground signals through the multilayer substrate to a respective die.

Figure 6:
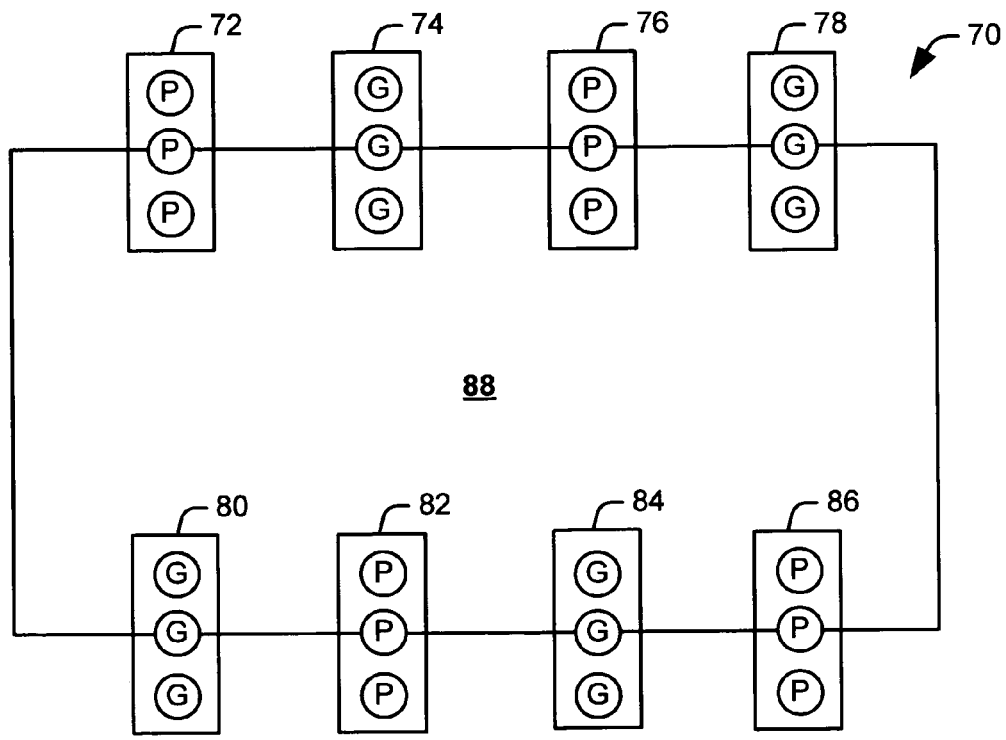
FIG. 6 illustrates yet another embodiment of power and ground pad via patterns associated with a bypass capacitor connection pad.

FIG. 6 illustrates yet another example of power and ground pad via patterns associated with a bypass capacitor connection pad 70. The bypass capacitor connection pad 70 has a plurality of power pads (72, 76, 82, 86) and a plurality of ground pads (74, 78, 80, 84) residing on a portion of an internal bond surface 88 of a multilayer substrate. The power and ground pads are operative for coupling, for example, to an Inter Digitated Capacitor (IDC), or other capacitor type with multiple power pads and ground pads. In the illustrated example, the bypass capacitor connection pad 70 includes four power pads (72, 76, 82, 86) and four ground pads (74, 78, 80, 84). The power pads (72, 76) and ground pads (74, 78) are interleaved on a first side of the bypass capacitor connection pad 70, and the power pads (82, 84) and ground pads (80, 84) are interleaved on a second side of the bypass capacitor connection pad 70. The first side of the bypass capacitor connection pad 70 includes a first power pad 72, adjacent a first ground pad 74, adjacent a second power pad 76, which is adjacent a second ground pad 78. The second side of the bypass capacitor connection pad 70 includes a third ground pad 80, adjacent a third power pad 82, adjacent a fourth ground pad 84, which is adjacent a fourth power pad 86. Each of the power pads includes a column of three power vias, and each of the ground pads includes a column of three vias. It is to be appreciated that other capacitor types with multiple power and ground connection pad patterns could include more or less power and ground connection pads and/or more or less vias per power and/or ground connection pads.

Figure 7:
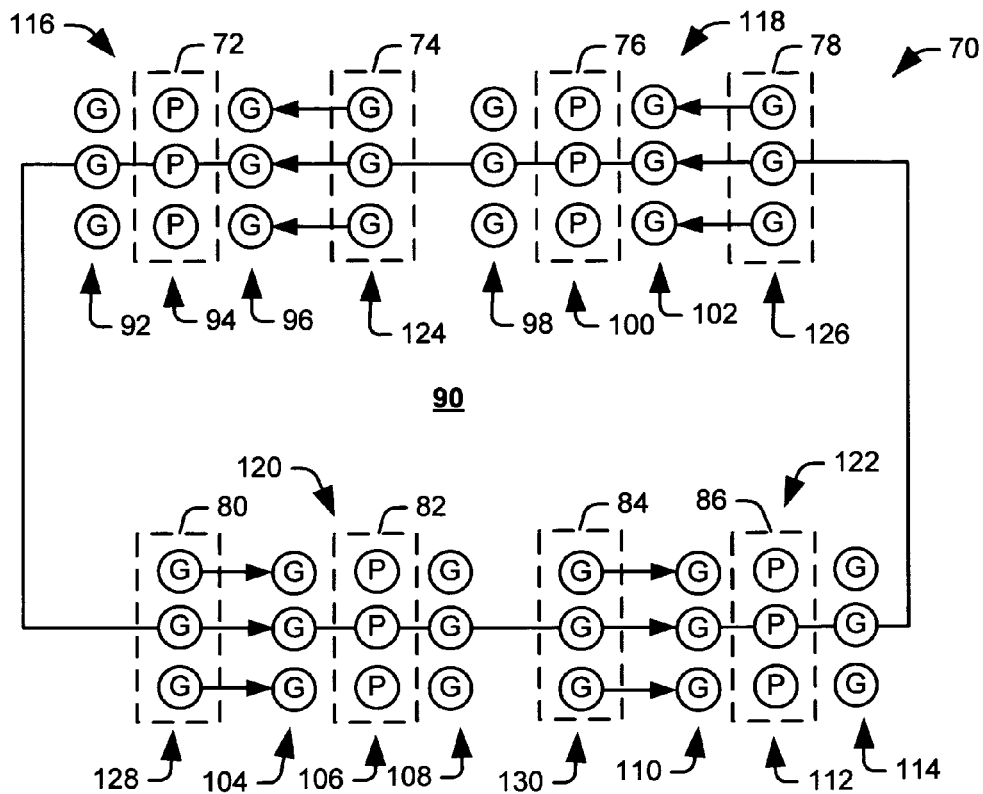
FIG. 7 illustrates yet another embodiment of power and ground via patterns at a first redistribution layer associated with the power and ground pad via patterns at the internal bond surface of FIG. 6.

FIG. 7 illustrates power and ground via patterns at a first redistribution layer 90 associated with the power and ground pad via patterns at the internal bond surface 88 of FIG. 6. The dashed lines provide an indication of the location of the power pads (72, 76, 82, 86) and ground pads (74, 78, 80, 84) at the internal bond surface 88 that overly the first redistribution layer 90. In the power and ground via patterns, columns of ground vias are jogged to a location adjacent a first side of a respective columns of power vias and an additional column of ground vias are added adjacent a second side of the respective columns of power vias at the first redistribution layer 90, such as a first ground layer. This provides for each column of power vias to be disposed between a pair of adjacent ground via columns.

As illustrated in FIG. 7, a column of ground vias 124 associated with the first ground pad 74 are jogged to provide a column of ground vias 96 located adjacent a first side of the column of power vias 94 associated with the first power pad 72. An additional column of ground vias 92 are then provided adjacent a second side of the column of power vias 94 associated with the first power pad 72. The column of power vias 94 and the columns of ground vias 92 and 96 form a power and ground via pattern 116 that extends from the first redistribution layer 90 to a second redistribution layer, such as a power layer. The column of ground vias 92 can be spaced apart from the column of power vias 94 by a distance substantially equal to the minimum pitch associated with the multilayer substrate. Additionally, the column of ground vias 96 can be spaced apart from the column of power vias 94 by a distance substantially equal to the minimum pitch associated with the multilayer substrate.

A column of ground vias 126 associated with the second ground pad 78 are jogged to provide a column of ground vias 102 located adjacent a first side of the column of power vias 100 associated with the second power pad 76. An additional column of ground vias 98 are then provided adjacent a second side of the column of power vias 100 associated with the second power pad 76. The column of power vias 100 and the columns of ground vias 98 and 102 form a power and ground via pattern 118 that extends from the first redistribution layer 90 to a second redistribution layer. The column of ground vias 98 can be spaced apart from the column of power vias 100 by a distance substantially equal to the minimum pitch associated with the multilayer substrate. Additionally, the column of ground vias 102 can be spaced apart from the column of power vias 100 by a distance substantially equal to the minimum pitch associated with the multilayer substrate.

A column of ground vias 128 associated with the third ground pad 80 are jogged to provide a column of ground vias 104 located adjacent a first side of the column of power vias 106 associated with the third power pad 82. An additional column of ground vias 108 are then provided adjacent a second side of the column of power vias 106 associated with the third power pad 82. The column of power vias 106 and the columns of ground vias 104 and 108 form a power and ground via pattern 120 that extends from the first redistribution layer 90 to a second redistribution layer, such as a power layer. The column of ground vias 104 can be spaced apart from the column of power vias 106 by a distance substantially equal to the minimum pitch associated with the multilayer substrate. Additionally, the column of ground vias 108 can be spaced apart from the column of power vias 106 by a distance substantially equal to the minimum pitch associated with the multilayer substrate.

A column of ground vias 130 associated with the fourth ground pad 84 are jogged to provide a column of ground vias 110 located adjacent a first side of the column of power vias 112 associated with the fourth power pad 86. An additional column of ground vias 114 are then provided adjacent a second side of the column of power vias 112 associated with the fourth power pad 86. The column of power vias 112 and the columns of ground vias 110 and 114 form a power and ground via pattern 122 that extends from the first redistribution layer 90 to a second redistribution layer. The column of ground vias 110 can be spaced apart from the column of power vias 112 by a distance substantially equal to the minimum pitch associated with the multilayer substrate. Additionally, the column of ground vias 114 can be spaced apart from the column of power vias 112 by a distance substantially equal to the minimum pitch associated with the multilayer substrate.

The power and ground via patterns 116, 118, 120 and 122 include four arrays of power columns disposed between ground columns. The placement of the power vias in between the power vias reduces the inductance associated with the power and ground loops caused by routing of power and ground signals through the multilayer substrate. The ground vias can be disposed around the power vias at a distance that is substantially equal to the minimum pitch to further minimize the inductance between the power and ground vias, thus mitigating deleterious effects associated with power and ground loops caused by routing power and ground signals through the multilayer substrate to a respective die.

Figure 8:
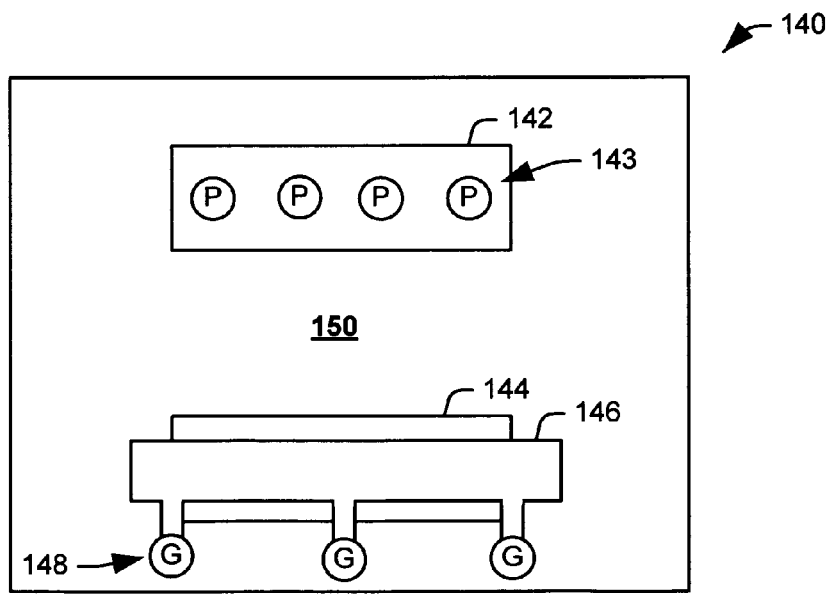
FIG. 8 illustrates an embodiment of a bypass capacitor connection pad associated with a bonding or ground layer of a substrate.
Figure 9:
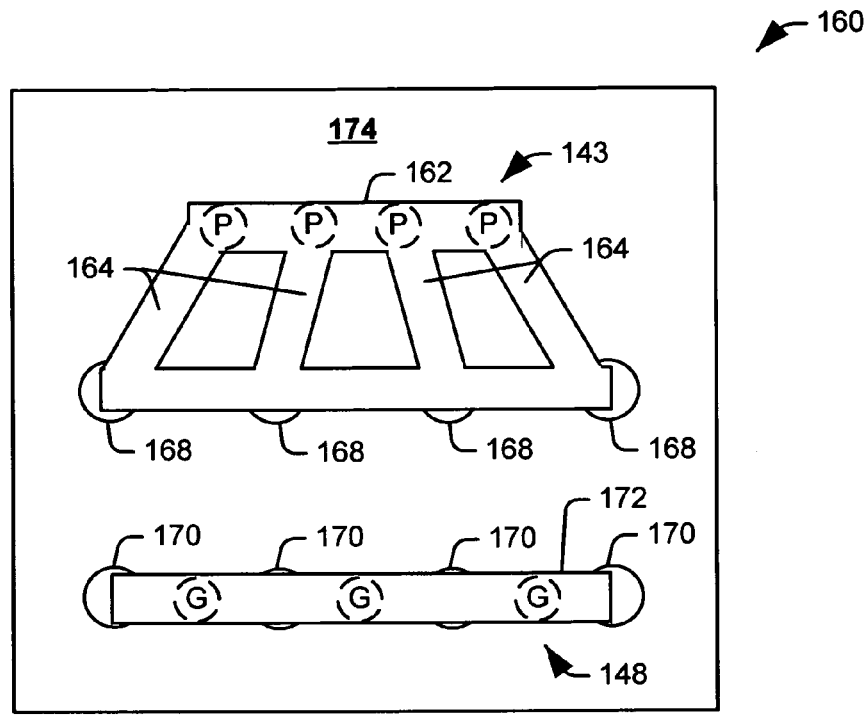
FIG. 9 illustrates an embodiment of power and ground via patterns at a second layer disposed internal to the bonding layer of FIG. 8.
Figure 10:
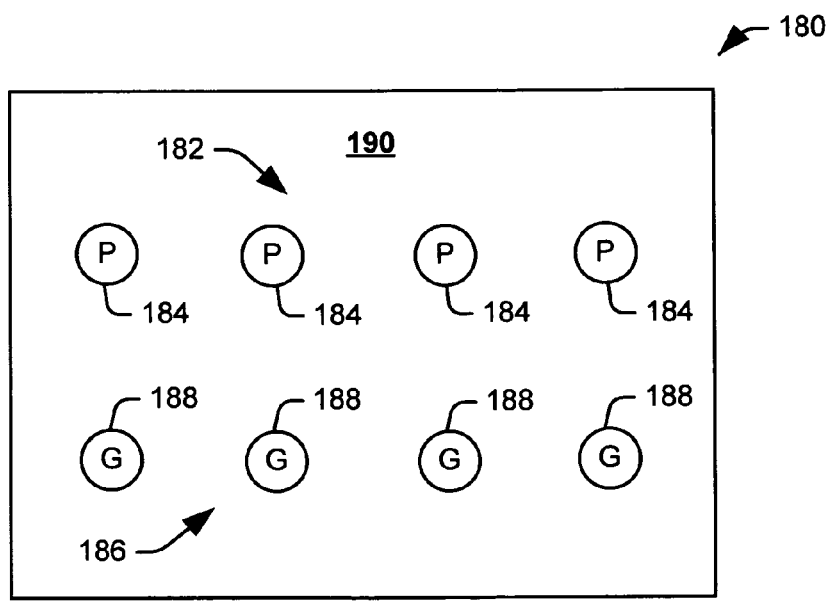
FIG. 10 illustrates an embodiment of power and ground PTH patterns disposed on a third layer internal to the second layer of FIG. 9.

FIGS. 8-10 illustrate bypass capacitor power and ground pad via patterns associated with three layers of a PCB. The bypass capacitor power and ground pad via patterns can be repeated on both a first side and a second opposing side of a PCB. FIG. 8 illustrates a bypass capacitor connection pad 140 associated with a bonding or ground layer 150 of a PCB. A PCB can have a bonding layer or ground layer on a first side of the PCB, and a bonding or ground layer on a second side of the PCB. The bypass capacitor connection pad 140 includes a bypass capacitor power pad 142 and a bypass capacitor ground pad 144 for coupling to different terminals of a bypass capacitor, such as a LICC. The bypass capacitor power pad 142 includes a plurality of power microvias 143 arranged in a single row. A row of ground microvias 148 are formed off the bypass capacitor ground pad 144. The row of ground microvias 148 are coupled to the bypass capacitor ground pad 144 by jogging a conductive line 146 to respective ground microvias in the row of ground microvias 148. In the present example, the row of ground microvias 148 includes a row of three ground microvias. The row of ground microvias 148 are disposed above a plurality of ground plated through holes (PTHs) in a power layer 174 (FIG. 9) disposed beneath the bonding or ground layer 150.

FIG. 9 illustrates power and ground via patterns 160 at a second layer 174 disposed internal to the bonding layer 150. The second layer 174 can be a power layer associated with the PCB. The power layer can reside internal to the bonding or ground layer 150. A PCB can have a power layer on a first side of the PCB, and a power layer on a second side of the PCB. The power microvias 143 from the bonding or ground layer 150 extend to the second layer 174, and the ground vias 148 from the bonding or ground layer 150 extend to the second layer 174. The second layer 174 includes a set of power PTHs 168, and a set of ground PTHs 170. A conductive line 162 couples the power microvias 143 together. A plurality of conductive lines 164 couple the power microvias 143 to the power PTHs 168. A conductive line 172 couples the ground microvias 148 to the ground PTHs 170.

FIG. 10 illustrates power and ground PTH patterns 180 disposed on a third layer 190 of the PCB. The third layer 190 is disposed internal to the second layer 174 of the PCB. The third layer 190 can be a second ground layer associated with the PCB. The second ground layer can reside internal to the bond layer 150, and the second layer 174. A PCB can have a second ground layer on a first side of the PCB, and a second ground layer on a second side of the PCB. The third layer 190 includes a PTH pattern with a row 182 of power PTHs 184, and a row 186 of ground PTHs 188. A respective power PTH 184 is aligned in a column with a respective ground PTH 188, such that each power PTH 184 is aligned alongside a ground PTH 188. The power PTHs 184 can be separated by the ground PTHs by the minimum allowable routing pitch of PTHs associated with the multilayer substrate. The power and ground PTHs associated with the second ground layer 190 can be coupled to power PTHs and ground PTHs on a second ground layer on an opposing side of the PCB, such that the inductance between the power and ground vias is minimized, thus mitigating deleterious effects associated with power and ground loops caused by routing power and ground signals through the PCB. The second side of the PCB can also include layers and connections as illustrated in FIGS. 8-10, such that bypass capacitors on both sides of the PCB can be coupled to power and ground microvias and PTHs in a similar manner.

Figure 11:
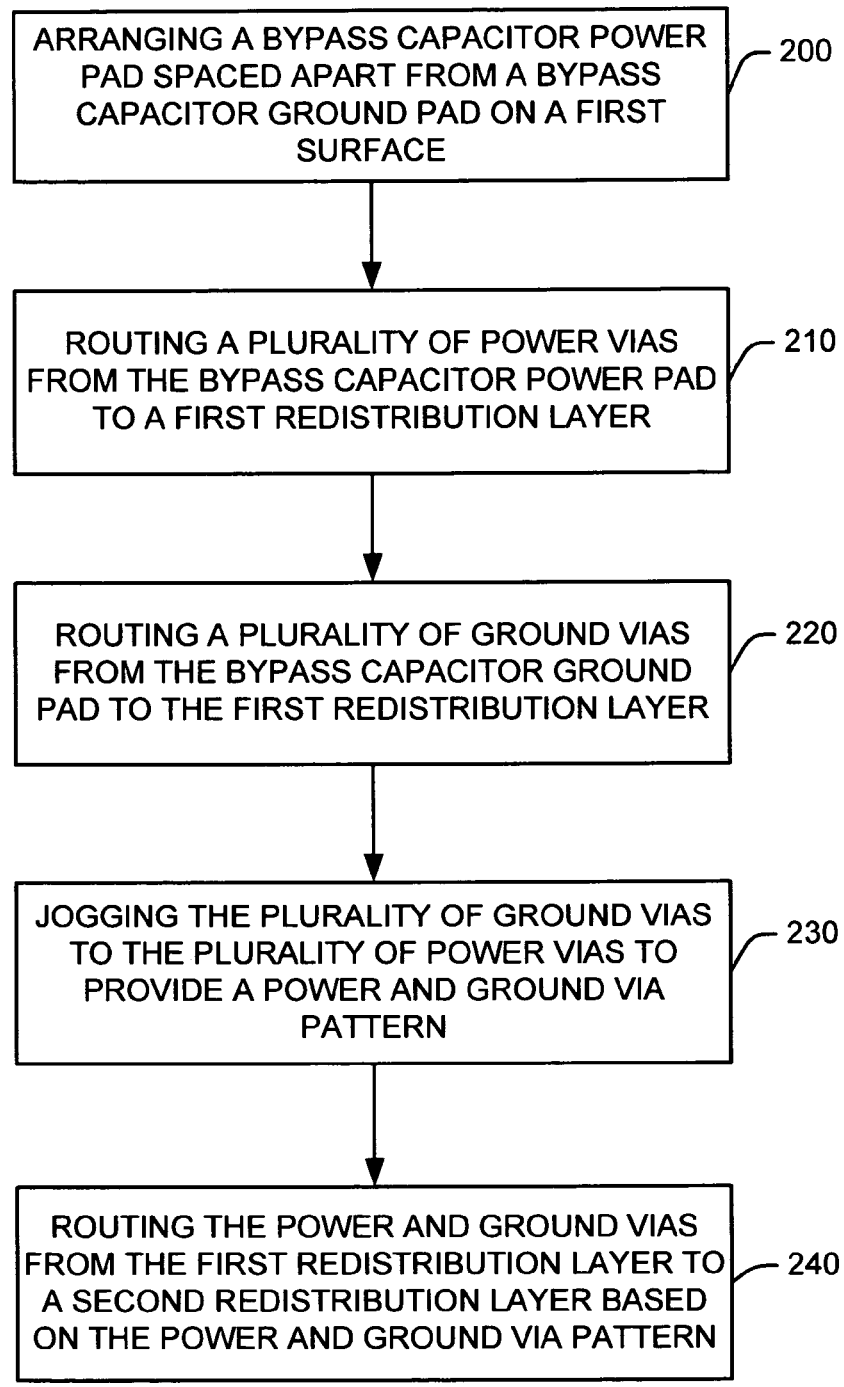
FIG. 11 illustrates an embodiment of a methodology for routing vias through a multilayer substrate having a plurality of layers extending between a first surface and a second surface.
Figure 12:
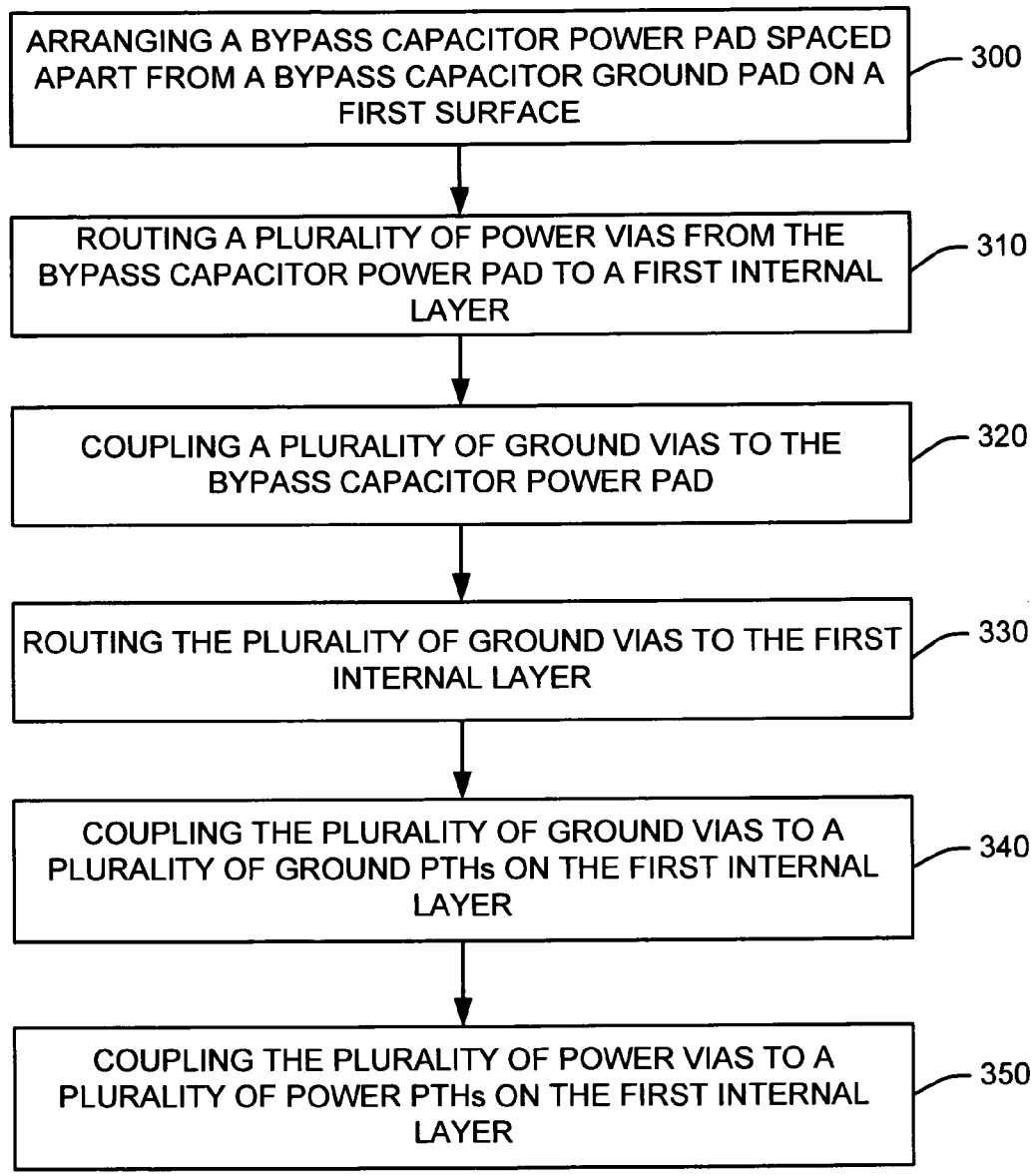
FIG. 12 illustrates yet another embodiment of a methodology for routing vias through a multilayer substrate having a plurality of layers extending between a first surface and a second surface.

In view of the foregoing structural and functional features described above, certain methods will be better appreciated with reference to FIGS. 11-12. It is to be understood and appreciated that the illustrated actions, in other embodiments, may occur in different orders and/or concurrently with other actions. Moreover, not all illustrated features may be required to implement a method.

FIG. 11 illustrates a methodology for routing vias through a multilayer substrate having a plurality of layers extending between a first surface and a second surface. At 200, a bypass capacitor power pad arranged spaced apart from a bypass capacitor ground pad on the first surface. At 210, a plurality of power vias are routed from the bypass capacitor power pad to a first redistribution layer spaced from the first surface. At 220, a plurality of ground vias are routed from the bypass capacitor ground pad to the first redistribution layer. At 230, the plurality of ground vias are jogged at the first redistribution layer to provide a power and ground via pattern. At 240, the power and ground vias are routed from the first redistribution layer to a second redistribution layer spaced apart from the first redistribution layer based on the power and ground via pattern.

FIG. 12 illustrates another methodology for routing vias through a multilayer substrate having a plurality of layers extending between a first surface and a second surface. At 300, a bypass capacitor power pad spaced is arranged spaced apart from a bypass capacitor ground pad on the first surface. At 310, a plurality of power vias are routed from the bypass capacitor power pad to a first internal layer. At 320, a plurality of ground vias are coupled to the bypass capacitor ground pad. The plurality of ground vias can be located on the bonding surface disposed above a plurality of ground plated through holes (PTHs) disposed on the first internal layer. At 330, the plurality of ground vias are routed to the first internal layer. At 340, the plurality of ground vias are coupled to the plurality of ground PTHs via a conductive line. At 350, the plurality of power vias are coupled to a plurality of power PTHs by jogging the power vias to the plurality of power PTHs employing respective conductive lines.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A multilayer substrate having a bonding surface, the substrate comprising:
   a bypass capacitor connection pad disposed on the bonding surface, the bypass capacitor connection pad having a bypass capacitor power pad and a bypass capacitor ground pad;

a plurality of power vias routed from the bypass capacitor power pad to a first redistribution layer spaced apart from the bonding surface;

a plurality of ground vias routed from the bypass capacitor ground pad to the first redistribution layer; and a plurality of power and ground vias routed from the first redistribution layer to a second redistribution layer according to a power and ground via pattern array, wherein the plurality of ground vias are jogged at the first redistribution layer to the plurality of power vias to form the power and ground via pattern array.

2. The substrate of claim 1, wherein the plurality of power vias are jogged at the first redistribution layer to the plurality of ground vias to form a second power and ground via pattern array.

3. The substrate of claim 2, wherein the power and ground via pattern array and the second power and ground via pattern array are comprised of a plurality of power via columns interleaved with a plurality of ground via columns, such that each power via column is adjacent at least one ground via column.

4. The substrate of claim 2, wherein the power and ground via pattern array resides at a location that is substantially beneath the bypass capacitor power pad and the second power and ground via pattern array resides at a location that is substantially beneath the bypass capacitor ground pad.

5. The substrate of claim 1, wherein the power and ground via pattern array is comprised of columns and rows of interleaving power and ground vias, wherein each power via has at least two adjacent ground vias.

6. The substrate of claim 1, wherein the power and ground via pattern array resides at a location that is substantially beneath the bypass capacitor power pad.

7. The substrate of claim 1, wherein the power and ground via pattern array is comprised of a column of ground vias adjacent a first side of a column of power vias.

8. The substrate of claim 7, wherein the power and ground via pattern array is further comprised of a second column of ground vias adjacent a second side of the column of power vias.

* * * * *